United States Patent
Girmay

[11] Patent Number: 5,414,280
[45] Date of Patent: May 9, 1995

[54] CURRENT DRIVEN VOLTAGE SENSED LASER DRIVE (CDVS LDD)

[75] Inventor: K. Girmay Girmay, La Mirada, Calif.

[73] Assignee: Xerox Corporation, Stamford, Conn.

[21] Appl. No.: 173,016

[22] Filed: Dec. 27, 1993

[51] Int. Cl.⁶ .......................................... H01L 33/00
[52] U.S. Cl. ........................... 257/80; 257/82; 257/84; 257/467; 257/921; 372/24; 372/29; 372/31; 372/109; 372/514
[58] Field of Search ................... 257/80, 81, 82, 83, 257/84, 85, 467; 307/311; 330/271, 291; 372/50, 24, 29, 31, 33, 38, 34; 250/201.4

[56] References Cited

U.S. PATENT DOCUMENTS

| | | | |
|---|---|---|---|
| 4,718,068 | 1/1988 | Yoshikawa | 372/31 |
| 4,745,609 | 5/1988 | Yoshikawa | 372/29 |
| 4,876,442 | 10/1989 | Fukushima | 372/31 X |
| 4,945,541 | 7/1990 | Nakayama | 372/31 |
| 5,025,447 | 6/1991 | Ohashi | 372/31 |
| 5,123,023 | 6/1992 | Santerelli et al. | 372/29 X |
| 5,237,858 | 8/1993 | Horikiri et al. | 372/29 X |
| 5,268,914 | 12/1993 | Yamamuro et al. | 372/29 X |

FOREIGN PATENT DOCUMENTS 0240609  2/1990  Japan ....................... 372/24

Primary Examiner—William Mintel
Attorney, Agent, or Firm—Robert Cunha

[57] ABSTRACT

A laser control circuit in which the laser is driven by a voltage controlled, current driver. At the beginning of each scan, an outer loop senses the laser power, and compares it at an outer loop summing junction to a predetermined value to generate a correction, and then applies that correction to the current driver through an inner summing junction. Within each scan, an inner loop detects the voltage across the laser and applies it as a correction voltage to the inner loop summing junction. The result is that at the beginning of each scan the laser power is set, and during the scan the voltage across the laser is held constant.

1 Claim, 3 Drawing Sheets

CURRENT DRIVEN VOLTAGE SENSED LASER DRIVE (CDVS LDD)

BACKGROUND OF THE INVENTION

A temperature tracking circuit for driving a laser diode incorporating an inner loop which includes a light level detector for regulating the laser diode forward voltage, and a voltage-to-current converter for driving the laser.

A laser diode is typically set to its correct operating levels outside of the active scan region, but during active scan, the temperature of the laser can vary depending on the momentary duty cycles. For example, after a long string of "ON" or "OFF" pixels, the instantaneous temperature of the diode may rise or fall, and the output light intensity (power) may vary.

If the laser is being driven by a voltage source, the laser is self-correcting to some extent. That is, the variation in laser temperature is accompanied by a change in output power, as well as a change in forward voltage drop in laser diodes these two parameters track well. However, the problem with a voltage source is that it is sensitive to the capacitive elements of the laser, and is not a driver of choice in high data rate systems.

A current driver is the driver of choice that enables high data rates; however, the current drive and the laser output power do not track as well as voltage to power. An optimum design will have to incorporate the high bit rate capability of the current drive while retaining the inherent advantage of voltage and power tracking with temperature.

SUMMARY OF THE INVENTION

This circuit senses the power output of the laser, and uses it to drive a voltage source. However, a voltage-to-current converter is interposed between the voltage source and the laser. Thus, the resultant circuit has the advantages of both prior art circuits, Namely, the laser is driven by a current source, but the loop is regulated to a voltage, thereby achieving the best characteristics of both circuits.

DETAILED DESCRIPTION OF THE INVENTION

The circuit described herein uses a current driver for the laser which contributes to high speed and wide bandwidth, and uses the voltage drop across the diode as a measure of the diode output power. The result is an automatic power control circuit having fast speed and wide bandwidth operation while retaining a superior light level control and temperature compensation.

Figure 2:
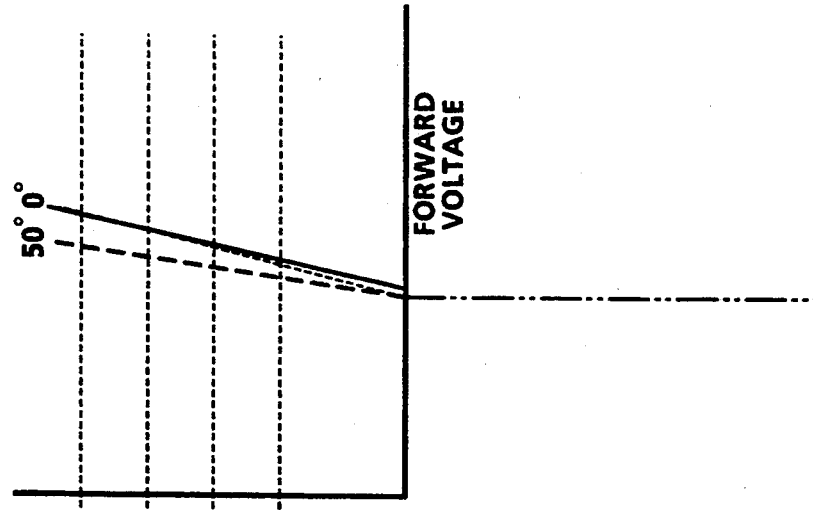
FIG. 2 a graph of power and current for three temperatures.
Figure 4:
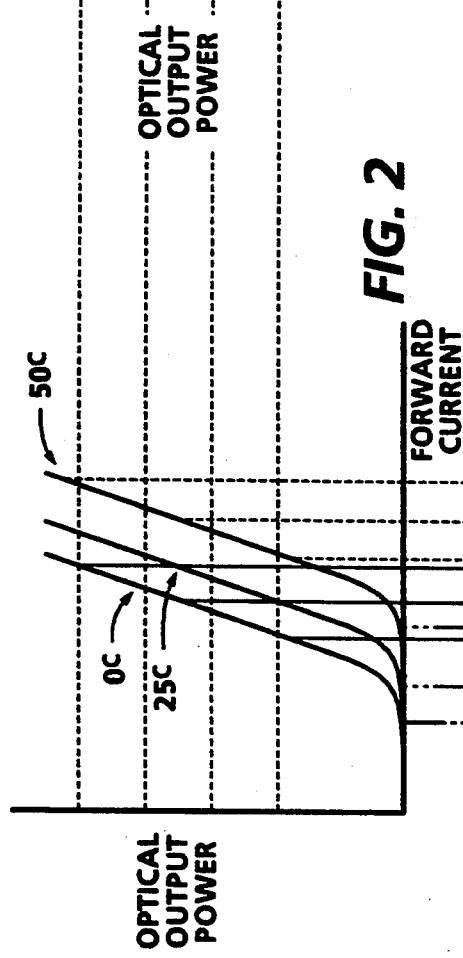
FIG. 4 is a graph of power and voltage.
Figure 3:
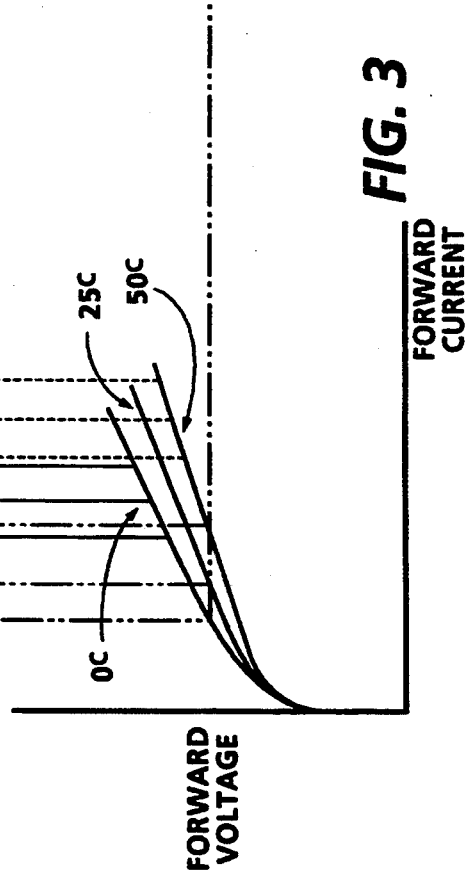
FIG. 3 is a graph of voltage and current for three temperatures.

FIG. 2 shows the relationship between output power and current at three temperatures. There is a large variaton in output power as the temperature varies with constant current. FIG. 3 shows the relationship between voltage and current, and from FIGS. 2 and 3, the data relating power and voltage can be extracted and plotted, as shown in FIG. 4. Notice that for a constant voltage in FIG. 4, there is less variation in power than there is for the constant current of FIG. 2.

The highly defined threshold voltage and the relatively low temperature sensitivity of output power in FIG. 4 suggests a voltage driver circuit would be desirable. However, voltage drivers have speed constraints that render them less attractive than current drivers, especially in high speed applications.

This invention uses current drivers to achieve high speed performance, but uses voltage as the key parameter to control the power output level, resulting in good power level control and minimum sensitivity to temperature variations.

The desired power is set to a predetermined level and the power output is monitored. The difference between the predetermined level and the actual power, as detected by a photodetector, is fed back to control the voltage, and that voltage is then used to control the current, so that the power matches the required level. The detector is outside of the active region, before the start of scan, so the sample rate is once per scan. The problem which remains is how to compensate for temperature variations, resulting from long strings of ON or OFF bits, that occur within the scan.

Figure 1:
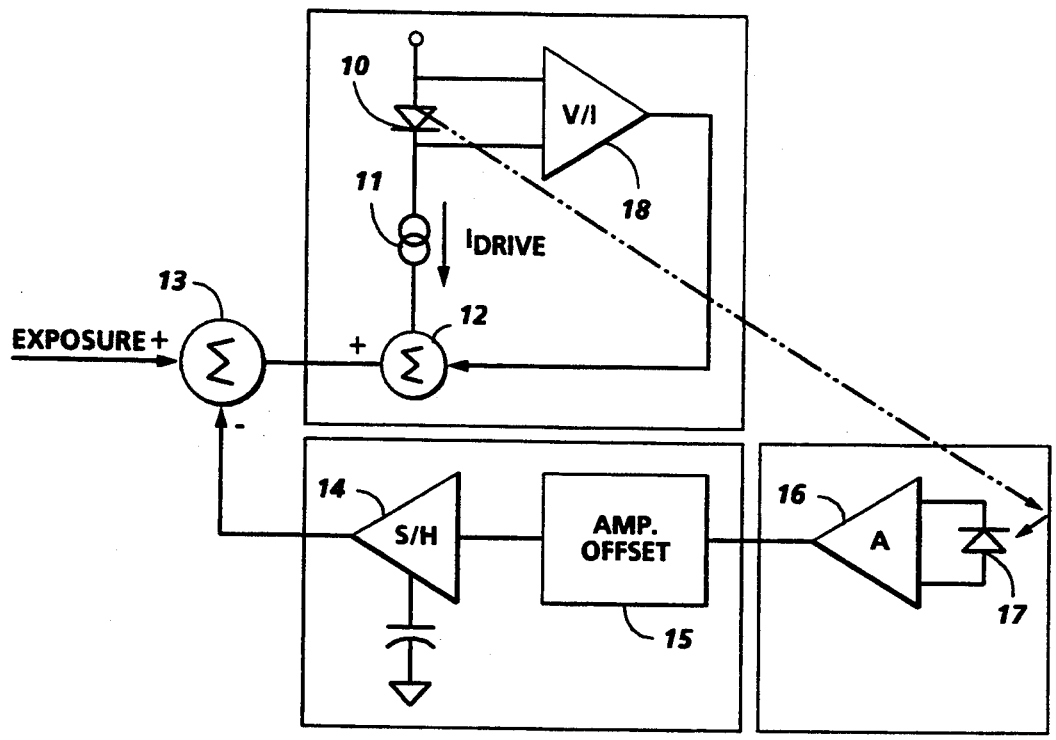
FIG. 1 is a block diagram of the circuit.

The circuit described herein is shown in FIG. 1. The outer loop, which calibrates the power level once per scan line, consists of the laser diode 10, the output of which is shown as a dotted line. The power is detected by a photo detector 17 and amplified by amplifier 16. The dc level of the output of this amplifier is offset by amplifier 15 and the result is applied to sample-and-hold device 14 which provides one input to the summing junction 13. The other junction input is the predetermined level that the laser should be set to. The output of the summing junction 13 is the final correction voltage which is applied to the inner loop, as described below. This correction is made once each scan.

The problem with correcting the laser power once per scan, typically either before or at the start of scan, is that during the scan, a long string of ON pixels may drive up the temperature of the laser. In the worst case, laser damage may result. For this reason, some designs gradually lower the power of the laser as time accumulates since the last calibration.

The inner loop in this circuit is designed to regulate the laser during the scan. The voltage across the laser 10 is sampled by the voltage-to-current converter 18, the output of which is applied to a second summing junction 12 which adds this correction current to the one generated by the outer loop at the output of the first summing junction 13. The sum of both correction currents is then applied to the current generator 11 which drives the laser 10. The inner loop thus minimizes any laser output drift between light output (outer loop) calibrations.

Figure 6:
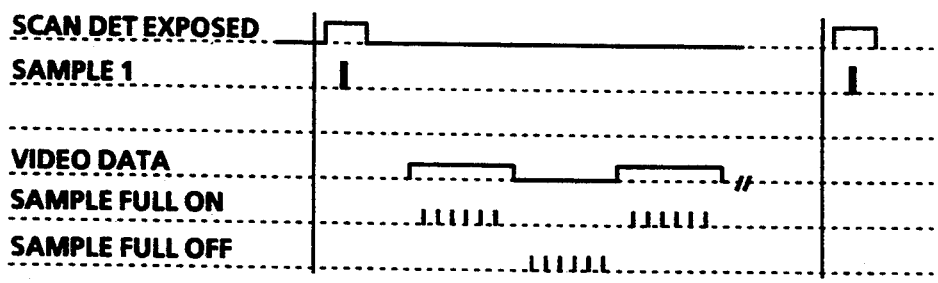
FIG. 6 is a timing diagram.
Figure 5:
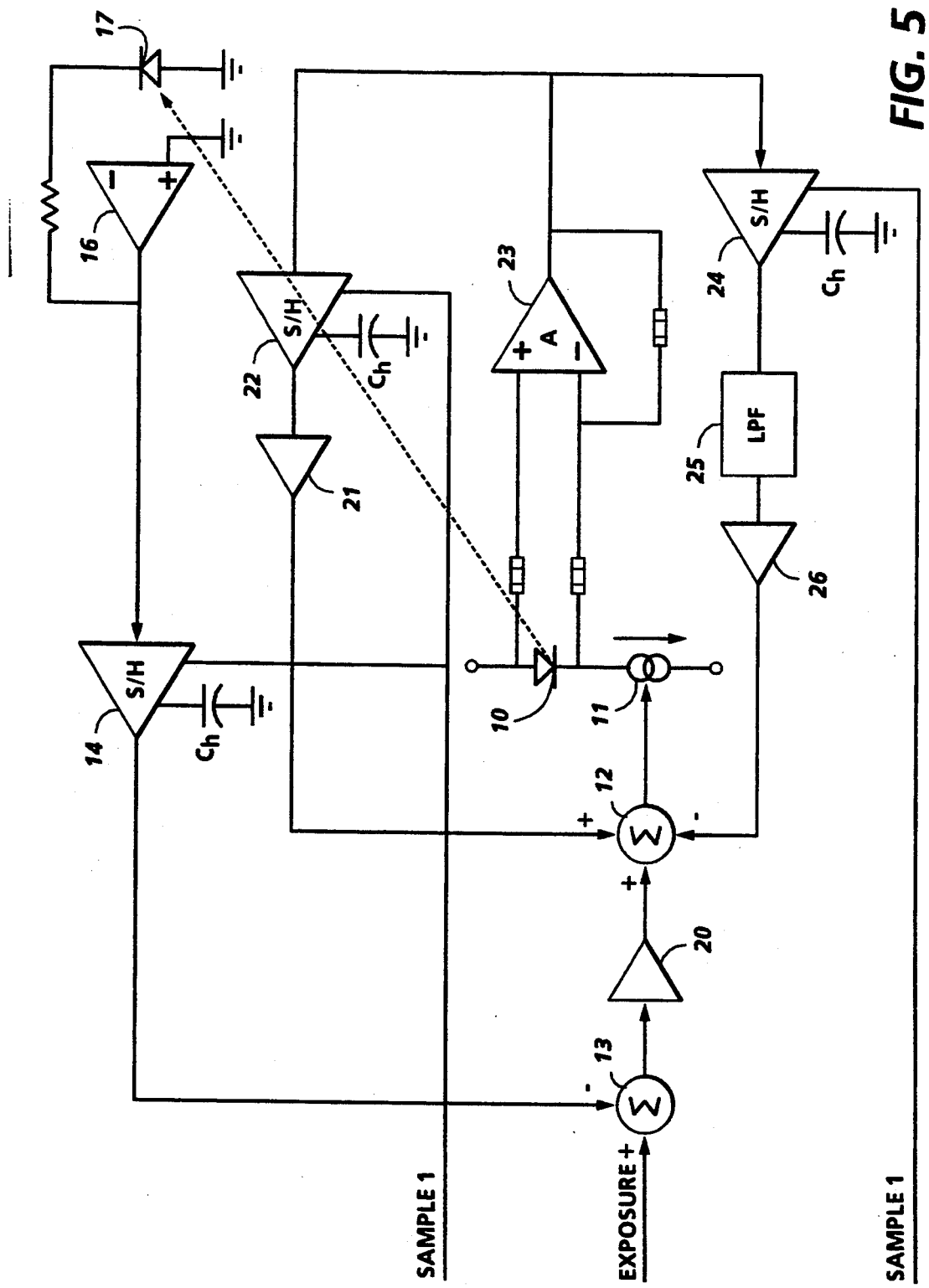
FIG. 5 is a schematic diagram of the circuit.

A schematic diagram of one embodiment and a timing diagram for it are shown in FIGS. 5 and 6, the complete circuit comprising an inner and outer loop.

The outer loop serves two purposes. The first is to calibrate the laser diode voltage to the output laser. This is accomplished by sampling the laser power using a scan detector. The detector is exposed to a full-on power level every scanline. As the detector is exposed to this light level, a sample and hold circuit samples the corresponding forward laser voltage. This sampled voltage level is used as a reference for the inner loop in between scanlines. For a multiple beam light source, the same concept applies except that time domain multiplexing may be required to sample the two beam intensity levels independently and as isolated cases.

The second is to regulate and vary the light intensity level as requested by the exposure signal. Typically, the system power requirement is represented by an analog exposure level signal. Based on the exposure level presented to it, the driver adjusts the current drive level such that the exposure level requested is matched by the power output.

The inner loop serves a single purpose. It uses the laser voltage as its reference and regulates the forward voltage drop across the laser to that level. This inner loop may be implemented in different ways, the essence of the circuit is that the voltage drop across the laser is monitored and the driver current level adjusted to achieve a constant voltage drop across the diode.

FIG. 6 is the timing diagram illustrating the sequence of events. Not shown in this diagram is that the laser OFF current is determined by the exposure control setup or any other means of adjustment. This setup determines the OFF power level that the ROS can tolerate without significant loss of contrast. As the scan detector samples the laser OFF power level, a sample of the laser voltage is taken and held as reference for the desired OFF level voltage within the scanline (in between scan detector samples). After the OFF level reference voltage has been established, an ON level is presented by the exposure signal. The same routine is carried out to capture an equivalent voltage level across the diode for the full ON level.

After these two points have been determined, the laser power levels are regulated by the indirect method of regulating the laser voltage drop. Any error from the corresponding set points in the forward voltage drop across the diode is compensated for by increasing or decreasing the diode current drive. Since the power and voltage drop are tracking phenomena in a laser diode, the result is a well regulated and temperature compensated power output.

In FIG. 6, there is shown a window during which the scan detector is exposed, and the timing of the laser sample, which is used in the outer loop. Next is shown a sequence of video data comprising six pixels that are all ON, six that are OFF and six more that are ON. The inner loop exposes the voltage detector to the laser power during these ON and OFF periods.

FIG. 5 is the detailed diagram of the circuit. The laser 10 is controlled by an outer loop consisting of a light detector 17, the output signal of which is amplified in amplifier 16, sampled by sample and hold circuit 14 and applied to the summing junction 13 along with the predetermined exposure signal. The output of the summing junction 13 is amplified 20 and applied to the inner loop summing junction 12.

In the inner loop, amplifier 23 samples the voltage across the laser 10. When the laser is fully ON, the amplifier 23 output is applied through sample-and-hold 22 and amplifier 21 to the positive input of the inner junction 12. When the laser is fully Off, the amplifier 23 output is applied through sample-and-hold 24 and amplifier 26 to the negative input of the inner junction 12, the output of which is used to drive the current generator 11.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

I claim:

1. A circuit for regulating the power of the light output of a laser means comprising:
    a voltage controlled current generator for driving said laser means,
    an outer loop comprising,
        a) a light detector means for detecting the output power of said laser means and generating a power signal,
        b) an outer loop summing means responsive to said light detector means for comparing said power signal to a predetermined value and generating a corrected power signal, and
        c) an inner loop summing means for coupling said corrected power signal to said current generator, and
    an inner loop comprising a voltage detector means for determining the voltage across said laser means, for generating a voltage correction signal, and applying said voltage correction signal to said inner loop summing means as an input to be added to said corrected power signal.

* * * * *